(12) United States Patent
Stiller et al.

(10) Patent No.: US 11,887,805 B2
(45) Date of Patent: Jan. 30, 2024

(54) FILAMENT-LESS ELECTRON SOURCE

(71) Applicant: FEI Company, Hillsboro, OR (US)

(72) Inventors: John Stiller, Beaverton, OR (US);
Aaron Torok, Milwaukie, OR (US);
Kevin Kagarice, Portland, OR (US)

(73) Assignee: FEI Company, Hillsboro, OR (US)

( * ) Notice: Subject to any disclaimer, the term of this patent is extended or adjusted under 35 U.S.C. 154(b) by 140 days.

(21) Appl. No.: 17/491,039

(22) Filed: Sep. 30, 2021

(65) Prior Publication Data

US 2023/0101787 A1    Mar. 30, 2023

(51) Int. Cl.
*H01J 37/075* (2006.01)
*H01J 37/21* (2006.01)
*H01J 37/073* (2006.01)

(52) U.S. Cl.
CPC ............ *H01J 37/075* (2013.01); *H01J 37/21* (2013.01); *H01J 2237/06316* (2013.01)

(58) Field of Classification Search
CPC .......... H01J 37/073; H01J 37/28; H01J 9/025; H01J 37/21
See application file for complete search history.

(56) References Cited

U.S. PATENT DOCUMENTS

| 3,817,592 A | 6/1974 | Swanson |
| 7,064,477 B2 | 6/2006 | Magera et al. |
| 2019/0066966 A1* | 2/2019 | Kusunoki ............. H01J 37/073 |

* cited by examiner

*Primary Examiner* — Joseph L Williams
(74) *Attorney, Agent, or Firm* — Klarquist Sparkman, LLP

(57) ABSTRACT

Electron sources can include an electron source crystal coupled in series between opposing electrically conductive supports to form an electrically conductive path, wherein the electrical resistance of each of the electrically conductive supports is lower than the electrical resistance of the electron source crystal. Electron source crystals can include an emitting end and opposing shank end, wherein the shank end includes opposing leg portions. Electrically conductive supports can include foil supports spaced apart across a gap, wherein each of the opposing leg portions is attached to a respective foil support such that the foil supports are electrically connected to form the electrically conductive path. Particle focusing system are also disclosed. Electron sources can include an electron source crystal having an emitting end and opposing shank end, wherein the shank end is formed of a pair of opposing leg portions. Methods of manufacturing and operating electron sources are also disclosed.

18 Claims, 10 Drawing Sheets

FILAMENT-LESS ELECTRON SOURCE

FIELD

The field is electron sources.

BACKGROUND

Electron microscopes and other precision measurement and imaging devices typically include a cathode electron source to generate electron source beams. Electron sources such as Schottky emitters typically include a filament that is heated with electrical current. The filament extends between two electrical contacts and is bent to form a symmetric 'A' shape. As current passes through the filament, the apex of the filament rapidly heats, increasing in temperature by 1000 K or more. An electron emitter crystal (e.g., Tungsten <1 0 0>) is attached to the apex of the bend and receives the heat generated in the filament through the attachment to the filament. During operation of the source, the filament is heated, an electrostatic potential is applied between the emitter crystal and the adjacent anode, and the work function of the emitting surface on the emitter crystal is lowered with the application of ZrO. Due to the temperature increase and the lowered work function, emission of electrons from the crystal tip rapidly increases, thereby generating the electron source beam.

Unfortunately, electron sources with wire filaments are inefficient when operating at high temperature (i.e. 1800K in the Schottky example). All the power required to maintain the high temperature at the emitting surface is generated in the wire filament and then lost through radiation and thermal conduction. Operating materials at high temperatures results in various challenges such as significant thermal expansion, excess heat into surrounding components, etc. To lower operational power of the electron source radiation and thermal conduction must be reduced. A typical solution to this problem is to change the filament wire dimensions and material but this solution is limited by the mechanical properties of the filament wire. Thus, a need remains for improved electron sources and related methods.

SUMMARY

According to an aspect of the disclosed technology, electron sources include an electron source crystal coupled in series between opposing electrically conductive supports to form an electrically conductive path, wherein the electrical resistance of each of the electrically conductive supports is lower than the electrical resistance of the electron source crystal. In some examples, the electron source crystal includes an emitting end and opposing shank end, wherein the shank end includes opposing leg portions. In some examples, the electrically conductive supports comprise foil supports spaced apart across a gap, wherein each of the opposing leg portions is attached to a respective foil support such that the foil supports are electrically connected to form the electrically conductive path. Some examples further include a base and a pair of electrical contacts extending from the base, wherein an end of each foil support opposite the gap is attached to a respective electrical contact of the pair. In some examples, the foil supports extend perpendicularly outward from the respective leg portions in a length direction. In some examples, the foil supports extend in a height direction parallel to a longitudinal direction of the electron source crystal by at least 10× a thickness of the electron source crystal. In some examples, the foil supports have a thickness thinner than respective lengths and heights, wherein the thickness is less than 2× of a thickness of the electron source crystal. In some examples, the dimensions and materials of the foil supports are configured relative to the dimensions and materials of the leg portions such that the emitting end is heated to an emission temperature dominantly by a Joule heating occurring in the leg portions. In some examples, the foil supports comprise milled edges facing each other across the gap. In some examples, the foil supports are made of Tungsten, Rhenium, Hafnium, Tantalum, Molybdenum, or an alloy thereof. Some examples include a reservoir of material configured to lower the work function of the emitting surface situated on the electron source crystal. In some examples, the gap separates at least a portion of the reservoir. In some examples, the electrically conductive supports comprise wire members. In some examples, the electrically conductive supports comprise filament supports. In some examples, the shank end includes a pair of lead surfaces configured to couple to the respective electrically conductive supports such that coupling of the crystal to the electrically conductive supports causes current to pass from one lead through the crystal and out the other lead so that the crystal is heated primarily from within the crystal rather than by heat conduction from heat generated within the respective support members. Some examples include electron particle focusing systems including any of the electron sources described herein.

According to another aspect of the disclosed technology, electron sources include an electron source crystal having an emitting end and opposing shank end, wherein the shank end is formed of a pair of opposing leg portions.

According to a further aspect of the disclosed technology, apparatus include an electron source crystal and means for supporting the electron source crystal and for generating Joule heating primarily in the crystal during operation.

According to a further aspect of the disclosed technology, methods of forming an electron source include arranging an electron source crystal having an emitting end and opposing shank end, and removing a portion of the emitter through a portion of the shank end of the electron source crystal to form opposing crystal legs separated by a gap. In some examples, the arranging the electron source crystal comprises arranging the electron source crystal in relation to a conductive support member and the methods can further include attaching the shank end of the electron source crystal to the conductive support member to form an emitter assembly, wherein the removing the portion of the emitter comprises removing a portion of the emitter assembly (i) through the portion of the shank end of the electron source crystal to form the opposing crystal legs separated by the gap and (ii) through a thickness of the support member and across a height of the support member to form separate opposing supports spaced apart across the gap and electrically connected across the gap through the opposing crystal legs. In some examples, the attaching the shank end of the electron source crystal to the conductive support member comprises spot welding the shank end of the electron source crystal to the conductive support member. In some examples, the removing the portion of the emitter comprises laser milling the portion of the emitter. In some examples, the removing the portion of the emitter comprises focused ion beam (FIB) milling the portion of the emitter. Some examples include, before arranging the electron source crystal, attaching the conductive support member to a pair of electrical contacts extending from a base. In some examples, the arranging the electron source crystal in relation to the conductive support member comprises, with the conductive support member secured, delineating a position on the support member corresponding to an alignment position for the electron source crystal. In some examples, the delineating comprises forming an optical mark or pattern on the conductive support member. Some examples include placing a reservoir of a material configured to lower the work function of the emitting surface on the electron source crystal. In some examples, the removing the portion of the emitter through the portion of the shank end of the electron source crystal to form opposing crystal legs separated by a gap includes removing a portion of the crystal where the reservoir of material is situated. In some examples, the conductive support member comprises a conductive foil strip.

The foregoing and other objects, features, and advantages of the disclosed technology will become more apparent from the following detailed description, which proceeds with reference to the accompanying figures.

DETAILED DESCRIPTION

Figure 1A:
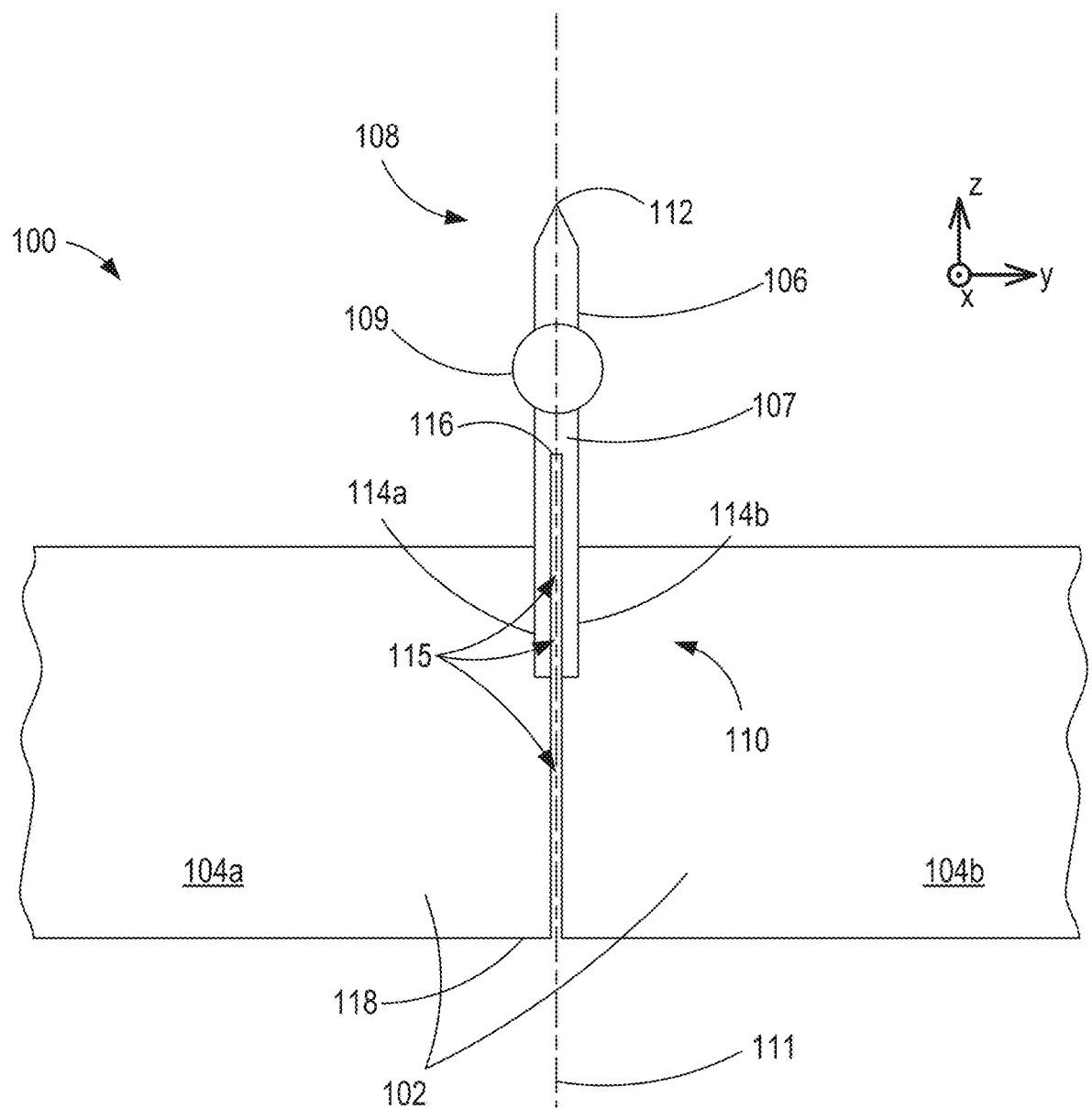
FIG. 1A is a side view of a electron source assembly, with a substantial portion of a foil length removed to show features of a split-shank emitter.

Schottky emitters are a type of electron source that use both electrostatic potential and temperature to produce emission. Disclosed Schottky electron source examples provide resistive heating of the crystal in the crystalline portion of the emitter crystal rather than predominantly in the filament/wire that conventionally support and heat the crystal. Disclosed examples also include other electron field emission sources, including cold electron sources (e.g., CFE, thermionic, nanowire, etc.). In various examples, such as the example shown in FIG. 1A and other figures, a larger amount of heating that occurs directly in the crystal instead of delivered to the crystal by a crystal support structure can provide various advantages, including improved thermo-mechanical stability of existing filament structures, lower power input and lower operating temperature of suppressor, extractor, and insulators proximate to the electron source. Such improvements can allow an improved local vacuum environment, improved manufacturing reproducibility and reduced manufacturing steps (e.g., elimination of pyrometer measurements), and a lower crystal reservoir (such as Zirconium oxide) operating temperature which can extend emitter lifetime.

In filament-based emitters, the primary purpose of the filament is to provide a source of thermal energy from Joule heating to enable the tip to operate at a high temperature, e.g., 1800K. While convenient, the filament also requires excessive operational power and produces a large thermal expansion and tends to produce thermo-mechanical drift. Further, at such higher temperatures, evaporation of the resistively heated filament can cause changes in filament temperatures and can worsen mean time between failures. Disclosed examples can conduct current through an electron source crystal (e.g., field emitter crystal), with the crystal having a higher resistance than the conducting paths into and out of the crystal, where the electron source crystal can be formed from monocrystals, polycrystals, or combinations thereof. Herein, the term crystal can represent any type of electron emission source that can be attached to a filament or foil. With the series connection, there can be a reduced reliance on the heat generation capability of the filament in heating the crystal to suitable operating emission temperatures.

For example, in A-shaped or other existing filament examples, the filament can be severed at the crystal connection, forcing current to conduct through the crystal and causing a substantial amount of the Joule heating that normally would be provided by the filament to instead occur in the crystal itself. Thus, existing filament structures, such as wires, can continue to be used. Some disclosed examples can also effectively remove the filament from the electron source structure. For example, foil strips or other support structures can be used to replace bent filaments typically used in commercially available electron sources. Example foil strips can be straight, spanning the distance between electrical contacts, and the emitter single crystal can be spot welded to the foil strip. The emitter and foil strip can form an emitter assembly that can be then plasma milled or laser milled to create a split emitter arrangement.

In some examples, the emitter can be milled to create a split emitter arrangement (e.g., without a foil strip or other support structure). With the single crystal at a suitable length, substantially all heating power is created in the two crystal legs. Where the single crystal is oriented along an optical axis for emission, substantially all thermal expansion of the emitter assembly is in that direction. Dimensions for the foil, single crystal, and milled section can be selected so as to limit temperature of the foil and the posts to which the foil is attached.

Figure 1B:
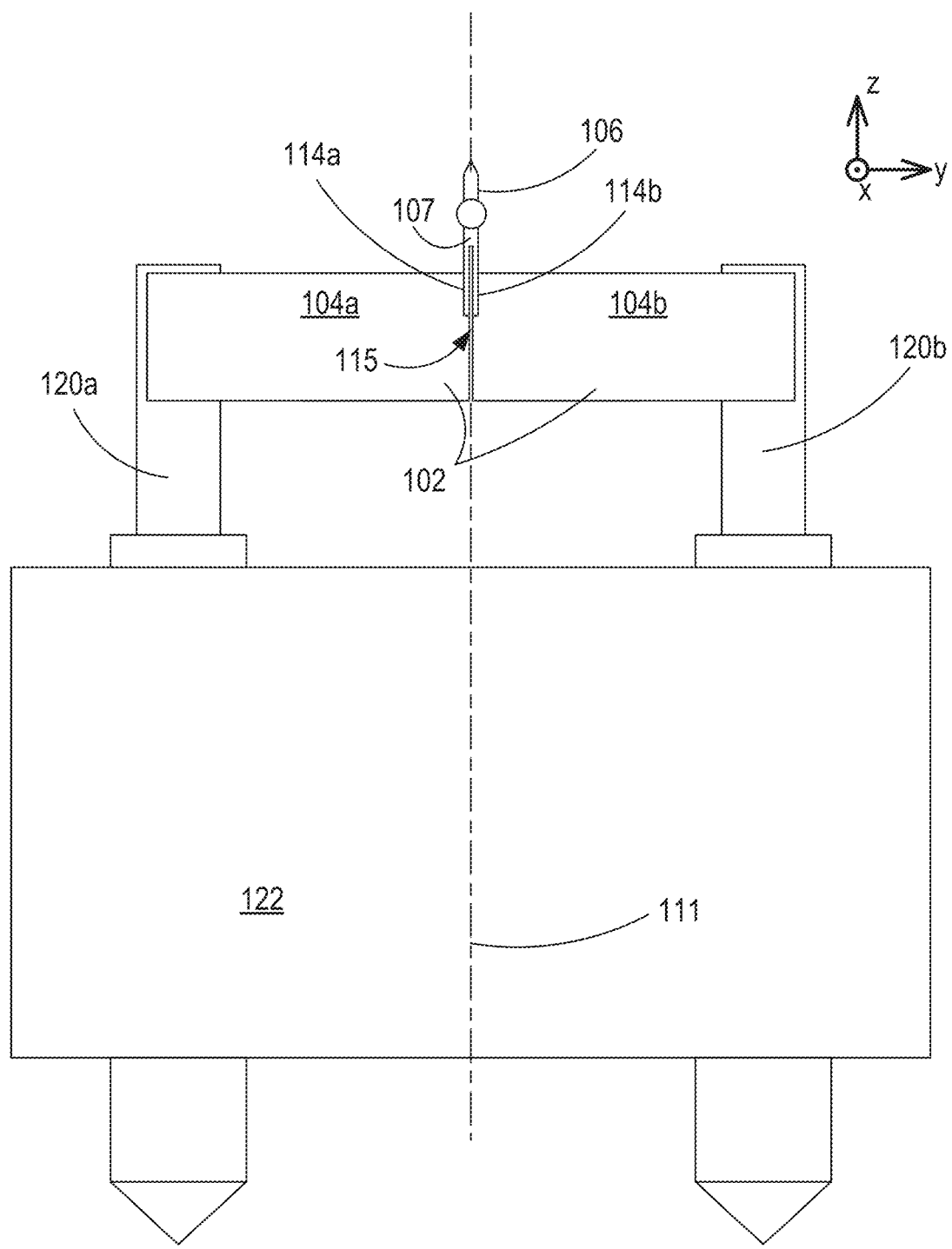
FIG. 1B is a side view of the electron source assembly in 1A, but demagnified to show a base and electrical contacts.

FIGS. 1A-1B show an example electron source assembly 100, including a foil strip 102 that has been laser-milled to form first and second foil supports 104a, 104b. In representative examples, the electron source assembly 100 is a Schottky electron source assembly. In further examples, the electron source assembly can be a cold electron source assembly, thermionic electron source assembly, nanowire-based electron source assembly, etc. The foil supports 104a, 104b can be made of various materials, such as Tungsten, Rhenium, Hafnium, Tantalum, Molybdenum, another metal, or a metal alloy. The selected material typically has a high melting point and is capable of holding an electron source crystal 106, e.g., through a spot-weld or laser weld attachment. In general herein, the emitter is referred to as a "crystal" which can encompass various electron source structures producing the electron emission, including nanowires. The electron source crystal 106 includes a main body 107 with an emitting end 108 and an opposing shank end 110. A crystal reservoir 109, e.g., of zirconium oxide is situated on the main body 107. The crystal 106 is arranged along an optical axis 111. The optical axis 111 is typically aligned with the optical axis of an associated system in which the assembly 100 is installed, such as an electron microscope. The crystal 106 is conventionally a single crystal, e.g., Tungsten, though other materials can be used in different examples, such as Rhenium, as discussed further below. The emitting end 108 includes an emitting surface 112 from which electrons are emitted. The emitting surface 112 is generally aligned with the optical axis 111 so that electrons emit from the emitting surface 112 in the direction of the optical axis 111. The shank end 110 includes a pair of crystal legs 114a, 114b which oppose each other across a gap 115. The crystal legs 114a, 114b join at an apex 116 spaced apart from the foil strip 102 (above in FIG. 1) such that the foil supports 104a, 104b are not directly connected to each other, with the gap 115 extending a height (e.g., in the z-direction) of the foil strip 102. Due to the presence of the gap 115, the foil supports 104a, 104b become electrically and mechanically coupled through the crystal legs 114a, 114b and a non-split portion of the main body 107 of the crystal 106. In various examples, the gap can be about 0.1 μm, 1 μm, 2 μm, 5 μm, 10 μm, 15 μm, 20 μm, 40 μm, or larger.

The foil supports 104a, 104b can have a small thickness that extends in an x-direction, e.g., into the plane of FIG. 1A, and a large height that extends in a z-direction, e.g., vertically in FIG. 1A. In some examples, the thickness can be in the range of 10 μm to 100 μm and the height can be in a range of 0.5 mm to 10 mm, though other thicknesses and heights can be possible, including uniform or non-uniform ones. The height and thickness of the supports 104a, 104b near the attachment to the crystal legs 114a, 114b generally defines a foil cross-sectional area. Example foil cross-sectional areas herein are typically larger than 'A' shaped cylindrical filament-based Schottky emitters. A larger foil cross-sectional area can provide more structural support for the electron source crystal 106. In typical examples, foil height is sufficiently large so that ends of the crystal legs 114a, 114b do not extend past a bottom edge 118 of the foil strip 102. The foil height also can be selected so that it is sufficiently large to allow manipulation with tweezers or other tools. In some examples, foil support thickness is selected in relation to the selected foil material and machining parameters of a milling process used to produce the gap 115. For example, some foil materials and milling processes can have a maximum material removal depth, or a maximum removal depth for a given set of processed crystal leg, gap, or foil support attributes. By way of example, attributes can include material burrs, splatter, heat weakened zones, warping, localized melting and resolidification, etc. Laser milling can be superior to FIB milling in some instances and can allow for a greater machining depth and therefore a larger foil thickness.

In general, the larger cross-sectional areas of the foil supports 104a, 104b (as compared with bent wire filaments) provide a lower electrical resistance. This can advantageously cause a larger fraction of Joule heating to occur in the crystal legs 114a, 114b rather than the foil supports 104a, 104b. Thus, the assembly 100 can be referred to as a filament-less electron source. By comparison, with an 'A' shaped filament-based emitter, substantially all of the current goes through its filament such that Joule heating occurs only in the filament. As the current flows through and heats up the filament, the emitter crystal is then heated only by conduction. In contrast, with the split crystal legs 114a, 114b of the shank end 110, the current path forces the current into the crystal legs 114a, 114b and main body 107 and thereby causes a significant fraction of the $I^2R$ heating to occur in the crystal 106. As the lengths of the crystal legs 114a, 114b increases, so does the energy that will be generated in the split section above the foil supports 104a, 104b.

Further, because the crystal legs 114a, 114b are formed by splitting the crystal 106, the cross-sectional area of the crystal legs 114a, 114b is decreased by about one half or more. For example, the cross-sectional area of each of the crystal legs of a split 0.127 mm diameter (5 mil) crystal is less than about 0.006 mm². Because resistance is inversely proportional to area, the splitting of the crystal 106 and corresponding reduction in current path cross-sectional area significantly increases electrical resistance. With the higher resistance, another significant benefit of disclosed examples is a corresponding reduction in supplied current and therefore supplied power to heat the emitter tips to an operating temperature (e.g., 1800 K). While a single bent filament Schottky electron source might not consume a significant amount of power in relation to other components of an electron microscope, large scale industrial systems using arrays of electron sources could realize substantial energy savings and lower operational temperature for the adjacent parts with the low-power attributes of disclosed examples using foil supports and split crystal legs. In some examples, additional energy savings are obtained by resistance increases provided by reductions in crystal diameter and by selection of higher resistance crystal material. For example, because area is proportional to the square of diameter crystal leg resistance increases rapidly for linear changes in diameter. Example crystal diameters can include less than 5 mils, such as 4 mils, 3 mils, or smaller. In some examples, crystal diameters can be larger than 5 mils, such as 6 mils, 8 mils, or larger. In some examples, other materials with higher resistivities than Tungsten may be used, such as Rhenium.

Figure 1C:
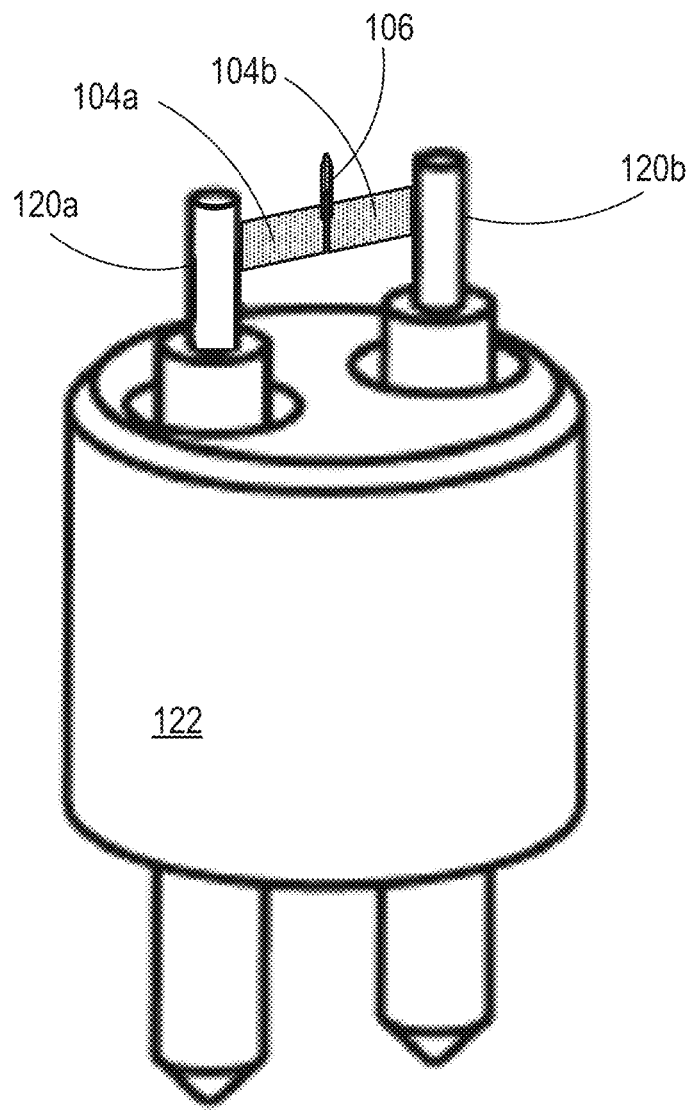
FIG. 1C is a perspective view of the electron source assembly in FIGS. 1A-1C.

FIGS. 1B-1C shows the electron source assembly 100 attached to electrical contacts 120a, 120b. The electrical contacts 120a, 120b can be in the form of posts which extend from a base 122, typically made of ceramic or another insulator. The foil supports 104a, 104b extend to the contacts 120a, 120b to define a foil strip length. In many examples, the electrical contacts 120a, 120b are radially arranged opposite a center of the base 122 in a symmetric manner, so that the emitter assembly 100 can be installed with the emitting surface 112 and longitudinal extent of the electron source crystal 106 aligned with the optical axis 111 and center of the base 122. In representative examples, one or more jigs can be used to position the crystal in the center position of the base 122. The aligned position of the electron source crystal 106 typically deviates less than 600 μm radially from the center of the base 122. During operation, a power source (not shown) is coupled to the contacts 120a, 120b to produce a current through the foil supports 104a, 104b, crystal legs 114a, 114b, and crystal main body 107.

As discussed above, by using the conductive foil supports 104a, 104b the cylindrical bent filament can be discarded. To heat an emitter tip to an 1800 K operating temperature, a cylindrical bent filament typically operates at 2000 K or higher. With the high temperature of the filament, there is also a significant amount of thermal expansion that occurs. Thus, even the smallest amount of asymmetry in the positioning of the filament in relation to the electrical contacts, in the positioning or orientation of the crystal attached to the filament, or in the filament itself, can result in various shifts in in the X, Y, and/or Z directions, e.g., from 1 to about 10 μm or more in X and/or Y and up to about 40 μm in the Z direction, or by angles with respect to the Z direction. In disclosed examples, with the primary amount of Joule heating occurring in the crystal 106, the foil supports 104a, 104b can remove any unnecessary energy that gets generated by conductively directing the heat into the posts of the electrical contacts 120a, 120b. Joule heating primarily in the crystal 106 can include arrangements in which the temperature in the crystal 106 is higher than the temperature of the foil supports 104a, 104b. Example temperature differences can include 50 K, 100 K, 200 K, 400 K, or more. The dimensions of the foil supports 104a, 104b and crystal 106 can also be selected to reduce power and thermal expansion. Preferably, the foil supports 104a, 104b remain under 1000 K during operation, and the posts of the electrical contacts 120a, 120b are in the range of 450 K to 700 K, though other temperatures are possible.

Thus, the foil supports 104a, 104b generally remain substantially cooler and with a corresponding reduction in thermal expansion as compared to a superheated 'A' shaped bent filament. In further examples, the filament, such as a bent filament, can be retained and the assembly milled or machined such that the split crystal leg portions are formed and the filament is split to provide a sufficient electrical resistance in the crystal relative to the filament so that Joule heating occurs primarily in the crystal.

Figure 2:
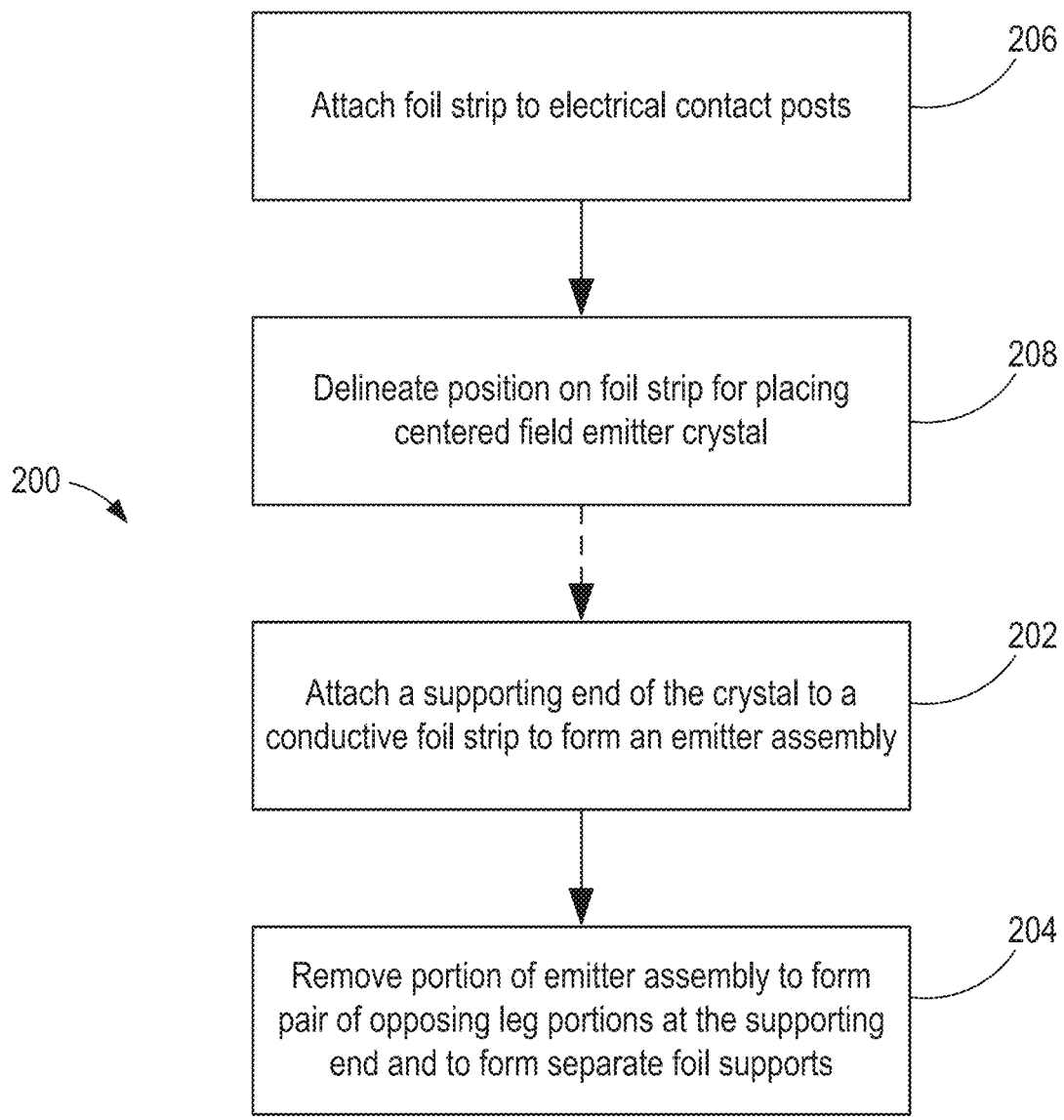
FIG. 2 is a flowchart of methods of forming electron source assembly.

FIG. 2 shows an example method 200 of fabricating an electron source assembly, such as a Schottky electron source assembly. At 202, a supporting end of an electron source crystal is attached to a conductive foil strip to form an emitter assembly. For example, the crystal can be attached through welding, adhesive, or another process. At 204, a portion of the emitter assembly is removed, e.g., by laser milling or FIB milling, to form a pair of opposing crystal leg portions at the supporting end of the crystal, and to form separate foil supports or other conductive supports. For example, the assembly can be removed by milling or machining through a portion of the shank end of the electron source crystal to form a pair of opposing crystal legs separated by a gap. The milling or machining can proceed through a thickness of the foil strip to fully create the gap. The removal typically continues across an entire height of the foil strip to form separate opposing foil supports spaced apart across the gap, so that the supports are electrically connected across the gap through the opposing crystal legs. In some examples, an additional non-conductive base can be attached to the foil to provide additional structural support, and the removal of material is not required to penetrate the non-conductive base because the current path is through the crystal legs. In further examples, the crystal can be held and the opposing crystal leg portions removed without milling through the foil strip or forming the foil supports. In such examples, foil supports or other conductive supports can be attached subsequently, or the split crystals can be secured to other structures.

In some examples, before attaching an electron source crystal to the foil strip at 202, the foil strip can be attached, at 206, to a pair of electrical contacts on posts extending from a base, e.g., by spot welding. By attaching the foil strip to the contacts prior to attaching the electron source crystal to the foil strip, additional bending and other stresses on the crystal associated with post-removal positioning and alignment of the strip and emitter assembly can be avoided. Further, because the electron source crystal is not yet attached to the foil strip, the alignment of the foil strip in attaching it to the contacts can proceed with less precision as the foil strip can lack bends or apexes associated with bent wire filaments.

Before proceeding with attaching the electron source crystal to the conductive foil strip at 202, the electron source crystal can be carefully aligned with a center position of the foil strip coinciding with a center position of the base. For example, various jigs can be used for the crystal and/or base and contacts to bring the crystal into an aligned position before attachment at 202. By attaching the crystal after the foil strip is attached and by avoiding the use of a filament, added steps associated with bent wire filaments can be avoided, such as an aligning of a filament apex relative to the base and an aligning the crystal relative to the filament apex so that it is precisely centered. In some examples, at 208, a position on the foil strip can be delineated for placing the electron source crystal in a centered and aligned position. For example, optical alignment indicia such as cross-hairs, lines, or other optical shapes, can be projected on the foil strip, e.g., with an LED or laser, and the crystal can be positioned relative to the alignment indicia before attachment at 202. In some examples, the indicia can be permanent marks, notches, grooves, etc. With the position delineated, the crystal can be attached to the foil at 202.

Figure 3:
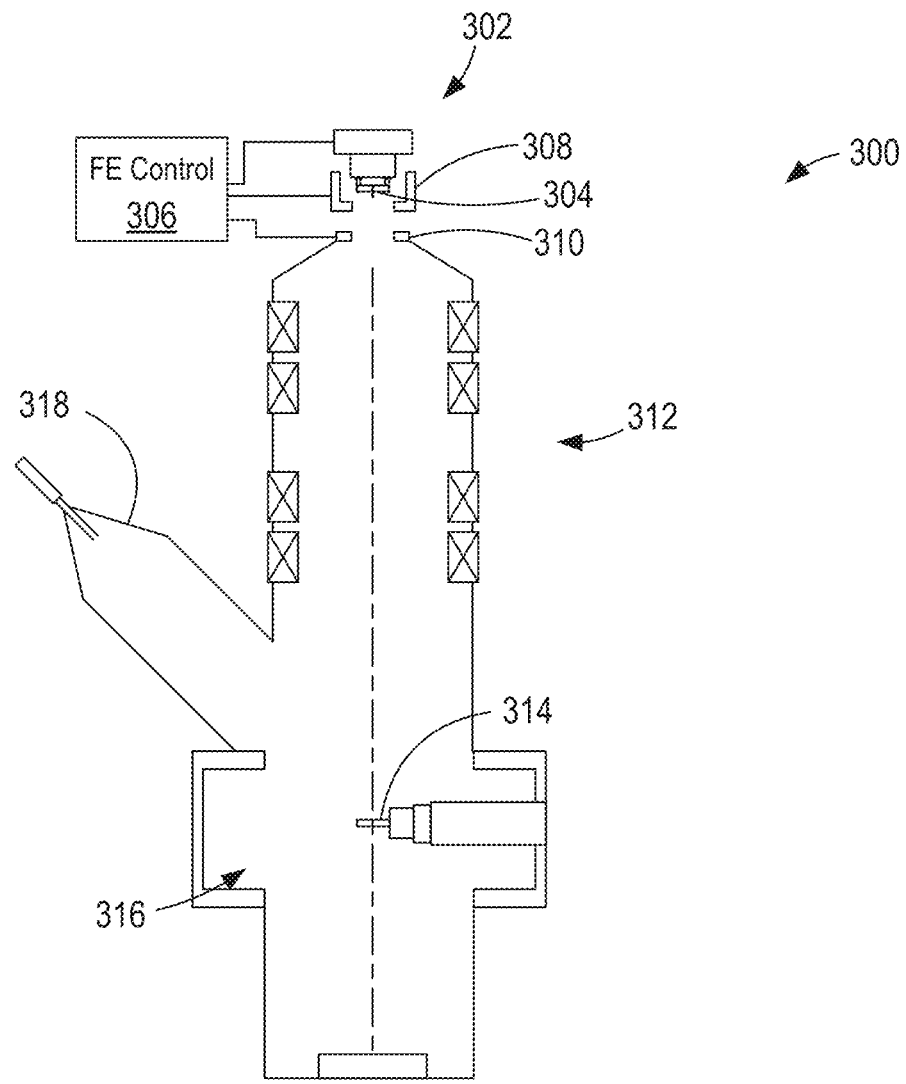
FIG. 3 is a side view schematic of an electron particle focusing system.

FIG. 3 is an electron particle focusing system 300 that include an electron emitter source 302 that can include as an electron source assembly 304 any of the filament-less type arrangements described herein. The electron emitter source 302 typically includes a power source and controller 306 coupled to the electron source assembly 304 to provide a current for heating the crystal primarily in the crystal rather than supporting foil legs. In typical examples, the power source and controller 306 can also be coupled to a cathode 308 and anode 310 to provide electropotential for increased field emission from the electron emitter source crystal tip of the assembly 304. A beam of electrons generated by the electron emitter source 302 is then directed through a particle focusing column 312 to a sample 314 arranged in a sample chamber 316. In some examples, the system 300 can include a focused-ion beam column 318 for directed ions to the sample 314. Examples of the system 300 can include transmission electron microscopes, scanning electron microscopes, scanning transmission electron microscopes, etc. Further examples can include critical dimension analysis systems (such as CD-SEMs), defect review systems, lithography systems, etc.

Figure 4:
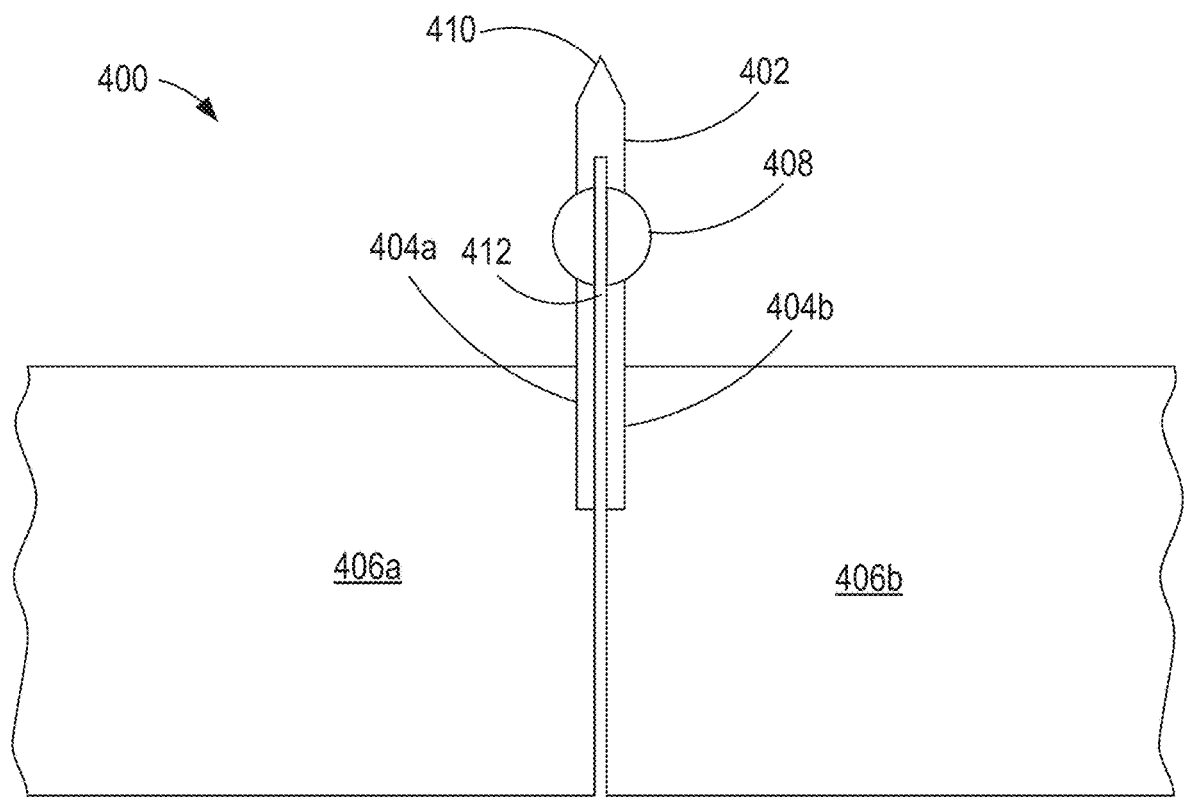
FIG. 4 is a side view of another electron source assembly with a gap extending through a zirconium reservoir.

FIG. 4 is an example electron source assembly 400 that includes an electron source crystal 402 having two legs 404a, 404b having respective portions secured to respective foil supports 406a, 406b. A crystal reservoir 408, such as Zirconium, is positioned on the crystal 402 adjacent to an emitter tip 410. A gap 412 between the legs extends at least partially through the zirconium oxide reservoir 408.

Figure 5:
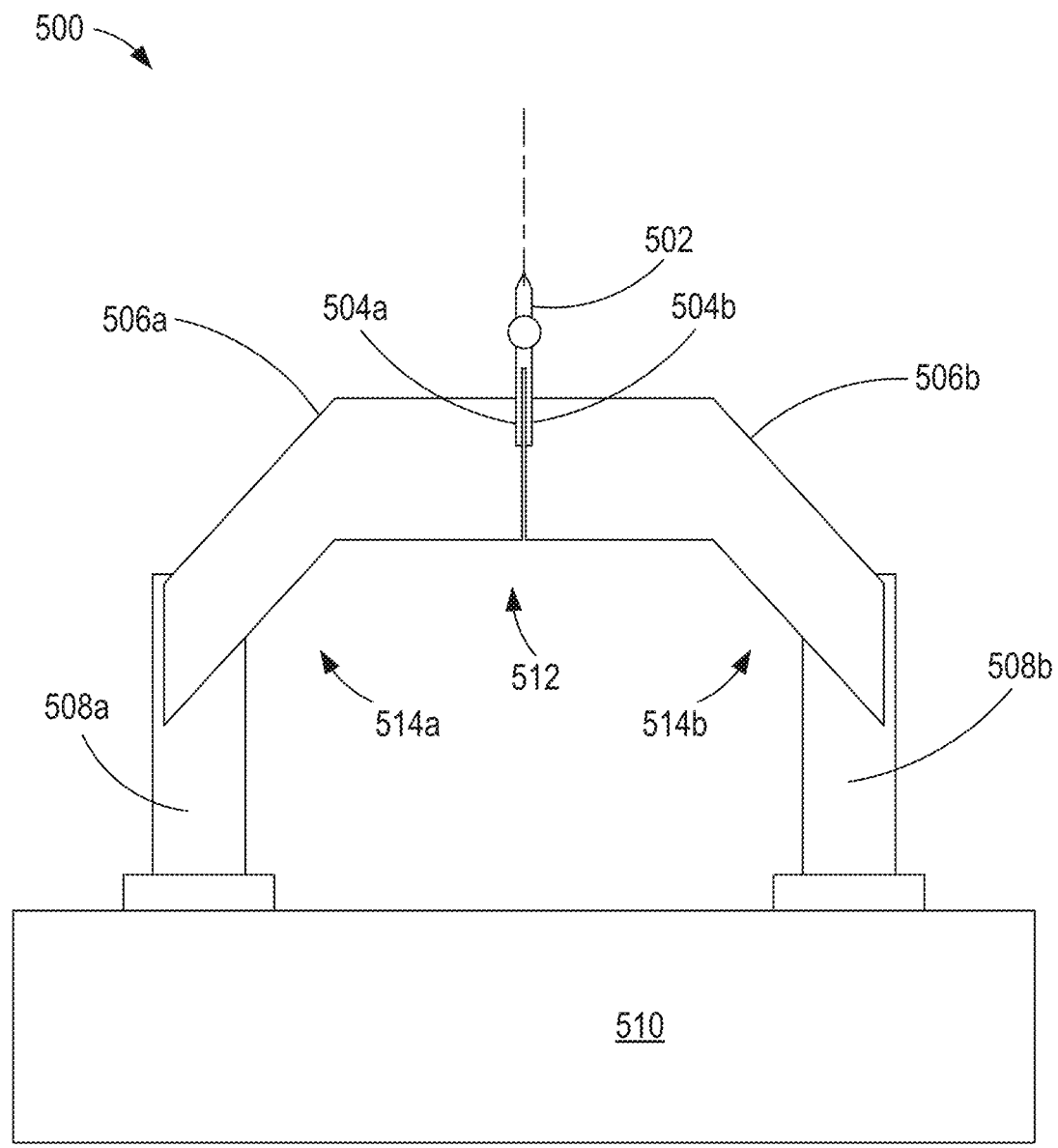
FIG. 5 is a side view of another electron source assembly with the foil supports having a platform geometry.

FIG. 5 is an example electron source assembly 500 that includes electron source crystal 502 having two crystal legs 504a, 504b attached to respective foil supports 506a, 506b. The foil supports 506a, 506b are attached to respective electrical contact posts 508a, 508b that are secured to a base 510. The foil supports 506a, 506b can be formed from a foil strip by machining through the crystal 502 and the foil strip, forming the legs 504a, 504b through the same process. The foil strip can include a non-rectangular shape. The foil strip can include a platform section 512 where the crystal 502 is secured before machining, and opposing leg members 514a, 514b which can be secured to the electrical contact posts 508a, 508b.

Figure 6:
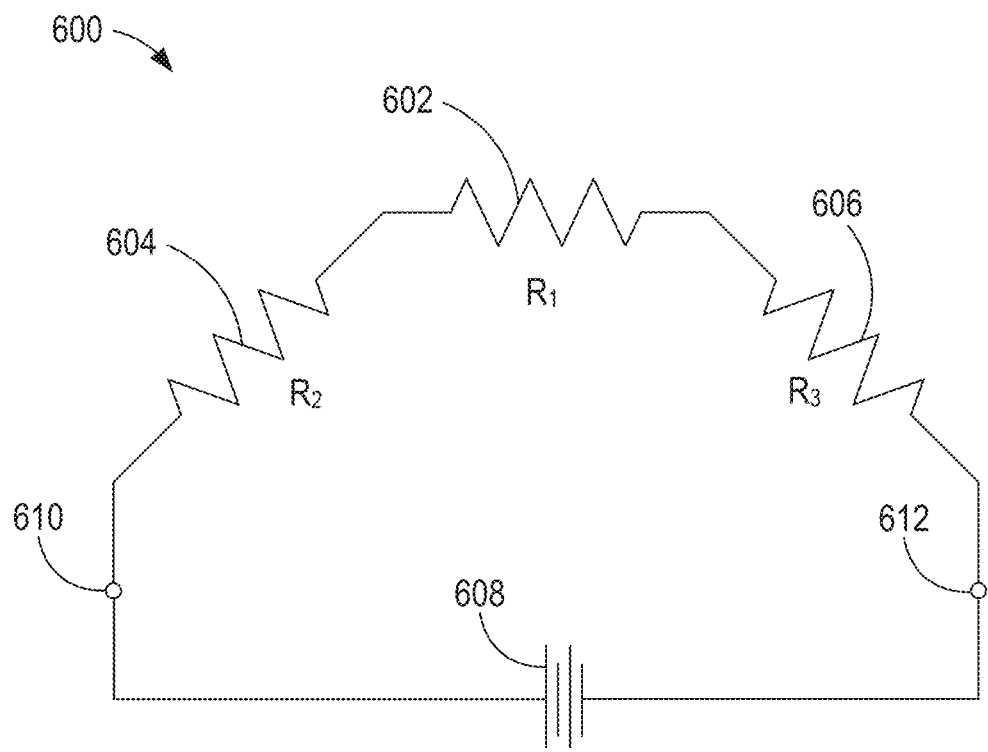
FIG. 6 is an electrical schematic of an electron source assembly.

FIG. 6 is an example electron source assembly 600 including an electron source crystal 602 having a resistance $R_1$ and conductive supports 604, 606 having respective resistances $R_2$, $R_3$ which are lower resistances than $R_1$. In representative examples, the electron source crystal 602 emits electrons in relation to a temperature of the crystal 602. An energy source 608 is coupled to contacts 610, 612 of the conductive supports 604, 606. The heat generated to increase the temperature of the crystal 602 is produced primarily in the crystal 602 by current flowing through the crystal 602 and its larger resistance $R_1$ as compared to the smaller resistances of $R_2$, $R_3$.

Figure 7:
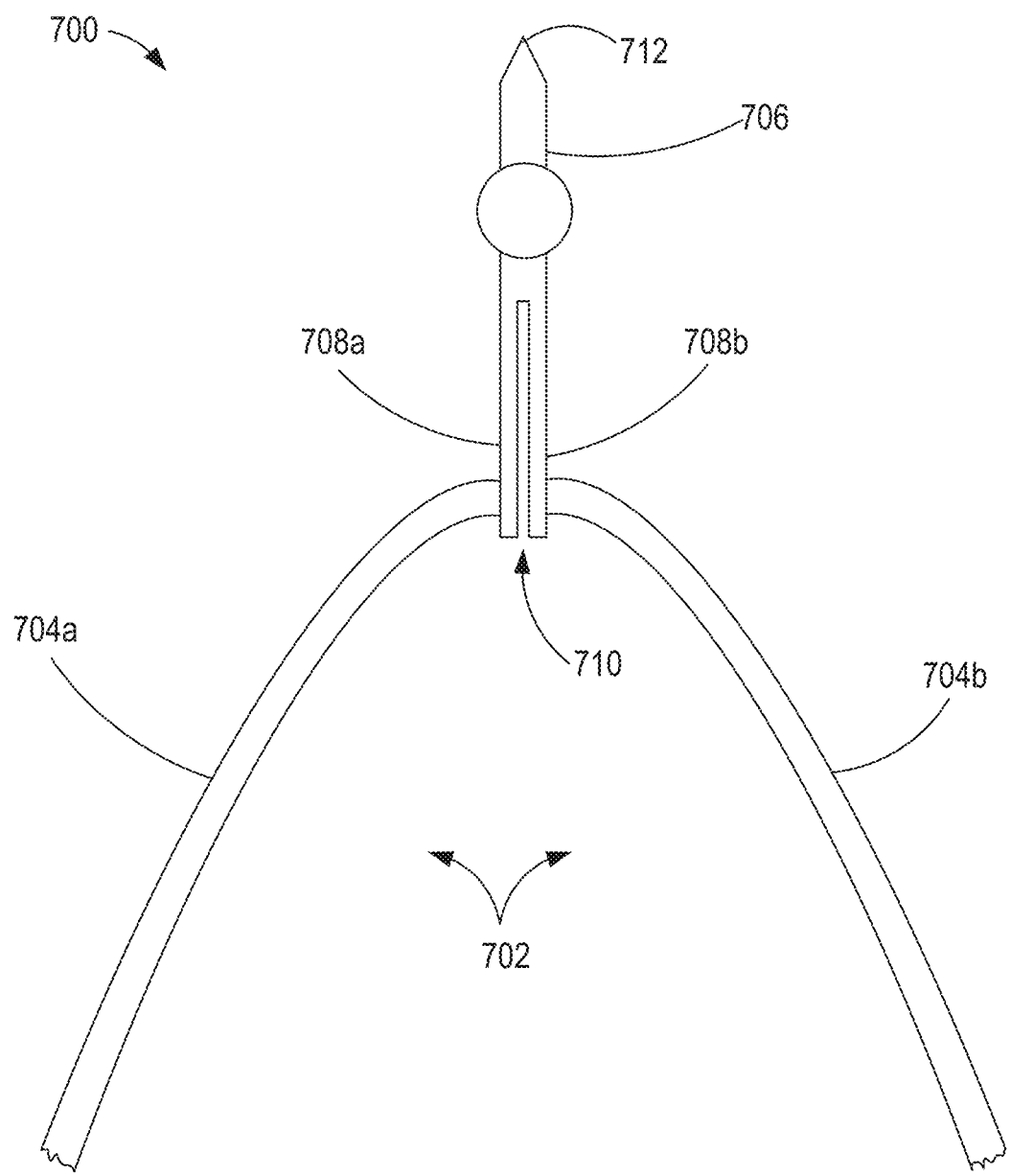
FIG. 7 is a side view of another electron source assembly using a severed filament.
Figure 8:
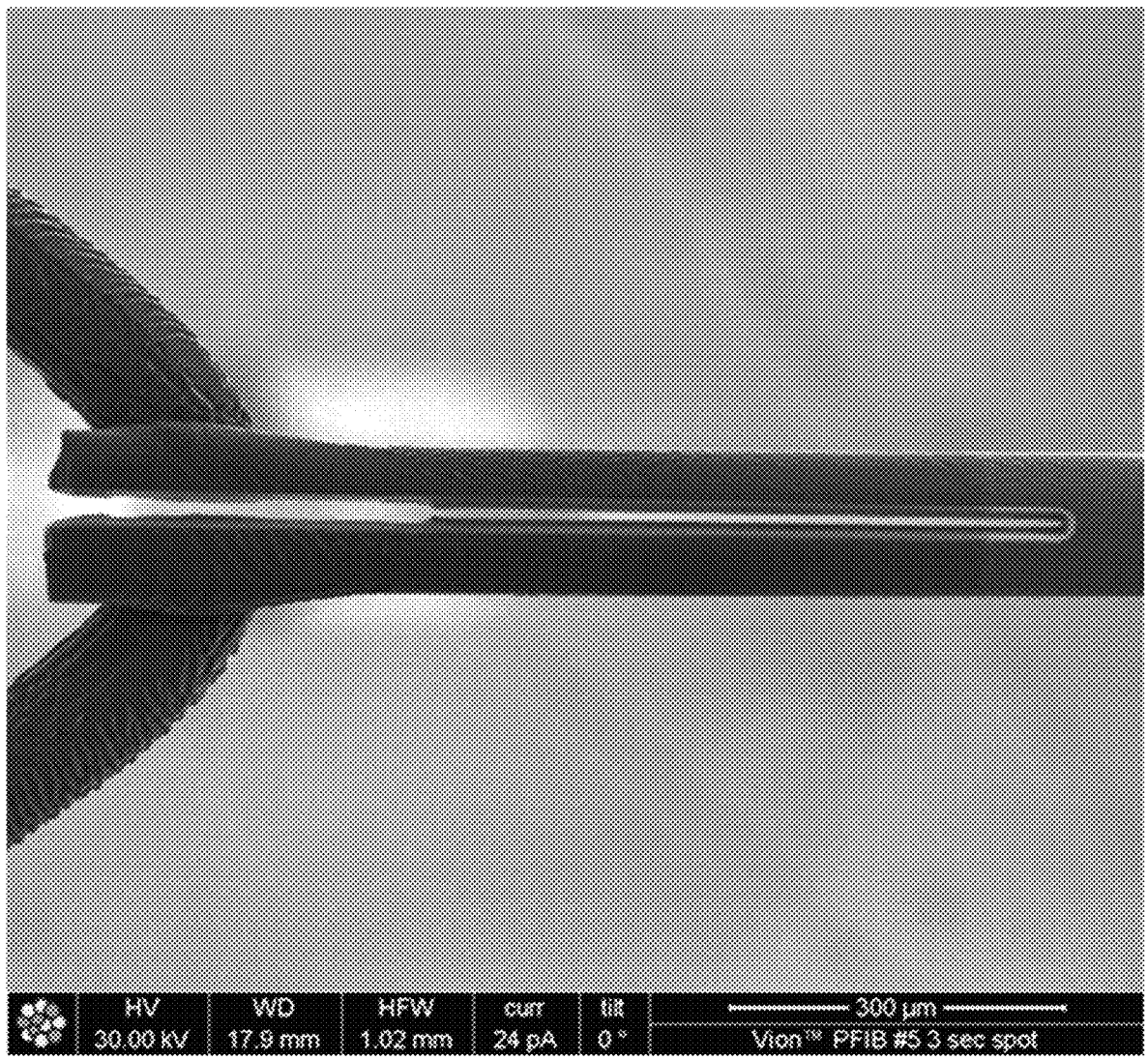
FIG. 8 is a microscope image of an example electron source assembly shown in FIG. 7.

FIG. 7 is an example electron source assembly 700 including a filament 702 that has been severed through FIB milling to form opposing filament supports 704a, 704b. The assembly 700 includes an electron source crystal 706 that includes respective leg portions 708a, 708b that have also been severed through the FIB milling to form a gap 710. Because electrical current is forced to travel through the crystal 706, heat is generated primarily in the crystal 706 to increase the crystal temperature for emission from an emitter tip 712 rather than from thermal conduction of heat generated resistively within the filament 702. FIG. 8 is a microscope image of an example electron source crystal attached to a filament, with a severed filament apex and severed crystal shank.

As with other examples described hereinabove, by splitting the shank of the emitter and allowing the current to flow in the shank, the heating power can be localized in the crystal 706, e.g., nearer to the tip 712, which can cause the supporting hairpin filament 702 to be roughly 200K cooler as compared to a typical emitter that does not include the series electrical path through the crystal 706. In particular examples, the inclusion of the split-shank configuration of the crystal 706 can be more efficient and with less radiation from the filament 702 due to the reduced temperature. Since the total heating power is reduced, suppressor and alumina base heating can also be reduced. The reduced heating also provides reduced waste heat transfer to all surrounding emitter elements, along with reduced operating temperatures and outgassing rates, thereby creating a better vacuum environment for the electron source.

A wide array of shapes for foil strip, filament wire, and other associated supports can be used in various examples. In some examples, a notch or other markings can be present to indicate alignment for securing to electrical contacts or for securing crystal supporting ends or crystal legs. During operation, the foil supports generally are heated to a lower temperature relative to the electron source crystal, such that thermal expansion has an attenuated or minimal effect. In some examples, the foil strip can be triangular, e.g., with an apex corresponding to a crystal position. Due to the reduced heating, any thermal expansion from even a large triangular structure will generally result in thermal expansion in a Z direction rather than X or Y, provided the cross-section and other characteristics of the foil leads to heating primarily occurring in the crystal. Rectangular strips configured to extend directly from contact to contact will typically result in a smallest Z-direction thermal expansion over other geometries, and substantially less expansion compared to A-shaped filament type emitters. Another benefit of disclosed examples is that a reduction in X and Y shift accompanies the reduction in Z-direction expansion.

General Considerations

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections.

In view of the many possible embodiments to which the principles of the disclosed technology may be applied, it should be recognized that the illustrated embodiments are only representative examples and should not be taken as limiting the scope of the disclosure. Alternatives specifically addressed in these sections are merely exemplary and do not constitute all possible alternatives to the embodiments described herein. For instance, various components of systems described herein may be combined in function and use. We therefore claim all that comes within the scope of the appended claims.

We claim:

1. An electron source, comprising:
    an electron source crystal coupled in series between opposing electrically conductive supports to form an electrically conductive path, wherein the electrical resistance of each of the electrically conductive supports is lower than the electrical resistance of the electron source crystal.

2. The electron source of claim 1, wherein the electron source crystal includes an emitting end and opposing shank end, wherein the shank end includes opposing leg portions.

3. The electron source of claim 2, wherein the electrically conductive supports comprise foil supports spaced apart across a gap, wherein each of the opposing leg portions is attached to a respective foil support such that the foil supports are electrically connected to form the electrically conductive path.

4. The electron source of claim 3, comprising:
    a base; and
    a pair of electrical contacts extending from the base, wherein an end of each foil support opposite the gap is attached to a respective electrical contact of the pair.

5. The electron source of claim 3, wherein the foil supports extend perpendicularly outward from the respective leg portions in a length direction.

6. The electron source of claim 3, wherein the foil supports extend in a height direction parallel to a longitudinal direction of the electron source crystal by at least 10× a thickness of the electron source crystal.

7. The electron source of claim 3, wherein the foil supports have a thickness thinner than respective lengths and heights, wherein the thickness is less than 2× of a thickness of the electron source crystal.

8. The electron source of claim 3, wherein the dimensions and materials of the foil supports are configured relative to the dimensions and materials of the leg portions such that the emitting end is heated to an emission temperature dominantly by a Joule heating occurring in the leg portions.

9. The electron source of claim 3, wherein the foil supports comprise milled edges facing each other across the gap.

10. The electron source of claim 3, wherein the foil supports are made of Tungsten, Rhenium, Hafnium, Tantalum, Molybdenum, or an alloy thereof.

11. The electron source of claim 2, comprising a reservoir of material configured to lower the work function of the emitting surface situated on the electron source crystal.

12. The electron source of claim 11, wherein the gap separates at least a portion of the reservoir.

13. The electron source of claim 2, wherein the electrically conductive supports comprise wire members.

14. The electron source of claim 2, wherein the electrically conductive supports comprise filament supports.

15. The electron source of claim 1, wherein the shank end includes a pair of lead surfaces configured to couple to the respective electrically conductive supports such that coupling of the crystal to the electrically conductive supports causes current to pass from one lead through the crystal and out the other lead so that the crystal is heated primarily from within the crystal rather than by heat conduction from heat generated within the respective support members.

16. An electron particle focusing system comprising the electron source of claim 1.

17. An electron source, comprising an electron source crystal having an emitting end and opposing shank end, wherein the shank end is formed of a pair of opposing leg portions.

18. An apparatus, comprising:
an electron source crystal having an emitting end and opposing shank end, wherein the shank end is formed of a pair of opposing leg portions; and
means for supporting the electron source crystal and for generating Joule heating primarily in the crystal during operation.

* * * * *